(12) United States Patent
Furuhata et al.

(10) Patent No.: US 6,423,643 B1
(45) Date of Patent: Jul. 23, 2002

(54) PROCESS OF MAKING CARRIER SUBSTRATE AND SEMICONDUCTOR DEVICE

(75) Inventors: Yoshio Furuhata; Tsuyoshi Kobayashi, both of Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 0 days.

(21) Appl. No.: 09/670,258

(22) Filed: Sep. 26, 2000

(30) Foreign Application Priority Data

Oct. 1, 1999 (JP) .............................. 11-280950

(51) Int. Cl.$^7$ .......................................... H01L 21/311
(52) U.S. Cl. ........................................ 438/694; 257/784
(58) Field of Search ............................ 438/15, 25, 26, 438/51, 55, 64, 112, 126, 127, 578, 612, 613, 665, 694, 742; 257/784, 724, 773, 787, 578

(56) References Cited

U.S. PATENT DOCUMENTS 6,072,239 A     9/2000  Yoneda et al.
6,339,261 B1 *  1/2002  Yonemochi et al. ......... 257/784
6,348,416 B1 *  2/2002  Toya et al. ................. 438/694

FOREIGN PATENT DOCUMENTS

JP            9-162348       12/1995

\* cited by examiner

*Primary Examiner*—David Nelms
*Assistant Examiner*—Bau T Le
(74) *Attorney, Agent, or Firm*—Paul & Paul

(57) ABSTRACT

A semiconductor device comprises a semiconductor element having a signal electrode and a ground electrode. A mounting part metallic film has a bottom area on which the semiconductor element is mounted and a stepped area located at a periphery of the bottom area and being higher in horizontal level than the bottom area. A connector part metallic film is spaced from the mounting part metallic film and arranged at a peripheral region thereof. The signal electrode of the semiconductor element is electrically connected to the connector part metallic film and the ground electrode of the semiconductor element is electrically connected to the stepped area of the mounting part metallic film. The semiconductor element is shielded with resin together with mounting/connecting sides of the mounting part metallic film and the connector part metallic film.

6 Claims, 9 Drawing Sheets

SECTION ALONG X-X'

$D \geqq 0.010$ mm
$E \geqq 0.015$ mm

|   |   | D | E |
|---|---|---|---|
| ① | ETCHING TIME, TOO SHORT | × | ○ |
| ② | ETCHING TIME, TOO LONG | ○ | × |

PROCESS OF MAKING CARRIER SUBSTRATE AND SEMICONDUCTOR DEVICE

BACKGROUND OF THE INVENTION

1. Field of the Invention

The present invention relates to a semiconductor device, a process for producing the same, a carrier substrate and a process for producing the same.

2. Description of the Related Art

As small-sized electronic equipments, such as mobile phones or others, have been come into wide use, there has been a demand for minimizing the size and cutting the production cost of semiconductor devices to be installed in such electronic equipments. A conventional semiconductor device, wherein a semiconductor chip mounted onto a lead frame is resin-shielded, has a problem in that an area extending between inner and outer leads or a mounting area is relatively large. Further, in a BGA (ball grid array) type semiconductor device, there is another problem in that the production cost is high because it necessitates a substrate for mounting a semiconductor chip.

To minimize a size of a semiconductor device and to reduce a mounting area therefor, as well as to cut the production cost, a semiconductor device has been proposed, for example, in Japanese Unexamined Patent Publication (Kokai) No. 9-162348. The semiconductor device disclosed in Kokai No. 9-162348 includes a semiconductor chip mounted onto a chip-cementing resin, a resin package in which the semiconductor chip is shielded with epoxy resin, and a metallic film covering a resinous projection formed on a mounting surface of the resin package, which metallic film is electrically connected to an electrode section of the semiconductor chip by wire-bonding. This semiconductor device is advantageous in that inner and outer leads are unnecessary, contrary to the case wherein a lead frame is used, no substrate is necessary for mounting the semiconductor chip as in the BGA type packages, and the metallic film facilitates heat dissipation as well as eases the mounting operation of the chip onto the substrate because the metallic film has the same function as the connector terminals.

In the above-mentioned semiconductor device of a type wherein a high-frequency semiconductor chip is mounted, the mounting part metallic film on which the semiconductor chip is mounted is preferably used as a ground terminal for preventing noise from entering so that the electric properties are stabilized. Accordingly, it is necessary to electrically connect the ground terminal to the mounting part metallic film.

For example, in a semiconductor device 51 shown in FIG. 6, a mounting part metallic film 53 on which a semiconductor chip 52 is mounted and a connector part metallic film 54 electrically connected to the semiconductor chip 52 are partially extended at the side of the mounting surface. A ground connector part 55 is extended outward from a peripheral edge of the mounting part metallic film 53. A ground electrode of the semiconductor chip 52 and the ground connector part 55 are electrically connected to each other with a wire 56, and a signal electrode and the connector part metallic film 54 are electrically connected to each other with a wire 58.

To design the mounting part metallic film 53 as compactly as possible and to make a length of the wire 56 as short as possible, the ground connector part 55 is preferably provided as close as possible to the semiconductor chip 52. Thereby, there has been a demand for forming the mounting part metallic film 53 in a stepwise configuration. For forming the mounting part metallic film 53 in a stepwise configuration, a process for producing a carrier substrate for the production of the semiconductor device 51 will be described with reference to FIGS. 7(a) to 7(h), 8(a) and 8(b). In this regard, a process for forming the mounting part metallic film 53 will mainly be explained, while avoiding the illustration of the connector part metallic film 54 in FIGS. 7(a) to 7(b).

In FIG. 7(a), an etching resist (photosensitive resist) 61 is coated on the respective surfaces of a metallic substrate 60, such as a copper plate. Then, as shown in FIG. 7(b), the exposure and development are carried out while overlaying a photo-mask on the etching resist to result in a pattern 62 having a central vacant space of a required size (see FIG. 8(a)). Thereafter, as shown in FIG. 7(c), a first half etching is carried out (to remove approximately a quarter of the thickness of the metallic plate 60) so that a connector recess 63 is formed. In this regard, when the metallic plate 60 is a copper plate, ferric chloride is preferably used as the etching liquid. Subsequently, in FIG. 7(d), the etching resist 61 is stripped off to result in the connector recess 63 in the metallic substrate 60.

In FIG. 7(e), an etching resist (photosensitive resist) 61 is again coated on the metallic substrate 60 on which the connector recess 63 has been formed, and the exposure and development are carried out while overlaying a photo-mask on the etching resist in alignment therewith to result in a pattern 64 having a central vacant space of a required size (see FIG. 8(b)). Then, a second half etching is carried out (to remove an approximately quarter of a thickness of the metallic substrate 60) in FIG. 7(f) so that a mounting recess 65 is formed. Next, in FIG. 7(g), the etching resist 61 is stripped off to form the connector recess 63 and the mounting recess 65 having different thicknesses from each other in a stepwise configuration. In this regard, an area and a thickness of the half etching are freely adjustable by changing the design of the central vacant space pattern in the photo-mask.

Next, in FIG. 7(h), a multi-layered metallic film is formed, while coating the remainder of the metallic substrate 60 other than the connector recess 63 and the mounting recess 65 with a resist, not shown, by the electrolytic plating, vapor deposition or sputtering. Thus a carrier substrate 66 on which the mounting part metallic film 53 is formed in a stepwise configuration.

The repetition of the steps of coating the etching resist 61 onto the metallic substrate 60 and half-etching the same after being exposed and developed complicates the production process to increase the production cost. To form the first central vacant pattern 62 and the second central vacant pattern 64 of different sizes at a position aligned with each other, a highly accurate alignment is required, which causes the generation of many rejected products to lower the yield.

SUMMARY OF THE INVENTION

Accordingly, an object of the present invention is to provide a semiconductor device capable of being mass-produced at a low cost, a method for producing the same, a carrier substrate used therefor and a method for producing the same by solving the above-mentioned problems in the prior art to simplify the manufacturing process.

According to the present invention, there is provided a semiconductor device comprising: a semiconductor element having at least one signal electrode and at least one ground electrode; a mounting part metallic film having a bottom area on which the semiconductor element is mounted and a stepped area located at a periphery of the bottom area and being higher in horizontal level than the bottom area; a connector part metallic film spaced from the mounting part metallic film and arranged at a peripheral region thereof; electrical connecting means for electrically connecting the signal electrode of the semiconductor element to the connector part metallic film and connecting the ground electrode of the semiconductor element to the stepped area of the mounting part metallic film; and a resin for shielding the semiconductor element, the electrical connecting means, and at least mounting/connecting sides of the mounting part metallic film and the connector part metallic film.

At least one of the mounting part metallic film and the connector part metallic film comprises a four-layered film consisting of a gold layer, a palladium layer, a nickel layer and a palladium layer sequentially layered from a bottom.

According to another aspect of the present invention, there is provided a carrier substrate adapted to be used for producing a semiconductor device, the substrate comprising: a metallic base having at least one reference surface, a central recessed area and a stepped recessed area located at a periphery of the central recessed area, a depth of the central recessed area from the reference surface being greater than that of the stepped recessed area from the reference surface; the area; the metallic base also having a peripheral recessed area spaced from the stepped recessed area and arranged at a peripheral region thereof; a mounting part metallic film formed on the central recessed area and the stepped recessed area; and a connector part metallic film formed on the peripheral recessed area.

In the same manner as the above, at least one of the mounting part metallic film and the connector part metallic film comprises a four-layered film consisting of a gold layer, a palladium layer, a nickel layer and a palladium layer sequentially layered from the metallic base.

According to still another aspect of the present invention, there is provided a process for producing a carrier substrate comprising the following steps of: coating respective surfaces, including a reference surface, of a metallic base with etching resist; partially removing the etching resist on the reference surface of the metallic base so as to form a central vacant pattern, a ring-like vacant pattern at a periphery of the central vacant pattern, and a connection vacant pattern spaced from the ring-like vacant pattern; half-etching the metallic base by using the etching resist as a mask and side-etching a part of the metallic base between the central vacant pattern and the ring-like vacant pattern so as to form a mount recessed area including a central recessed area and a stepped recessed area located at a periphery of the central recessed area, a depth of the central recessed area from the reference surface being greater than that of the stepped recessed area from the reference surface and also to form a peripheral recessed area spaced from the stepped recessed area and arranged at a peripheral region thereof; forming a mounting part metallic film and a connector part metallic film on the mount recessed area and on the peripheral recessed area, respectively; and removing the etching resist from the metallic base.

According to further aspect of the present invention, there is provided a process for producing a semiconductor device comprising the following steps of:

(a) forming a carrier substrate;

(b) mounting a semiconductor element, having at least one signal electrode and at least one ground electrode, on the bottom area of the mounting part metallic film;

(c) electrically connecting the signal electrode of the semiconductor element to the connector part and connecting the ground electrode of the semiconductor element to the stepped area of the mounting part metallic film;

(d) shielding, with a resin for shielding the semiconductor element, the electrical connecting means, and at least mounting/connecting sides of the mounting part metallic film and the connector part metallic film so as to form a shielded part; and (e) removing the shielded part from the carrier substrate together with the mounting part metallic film and the connector part metallic film.

A process further comprising a step for forming a stud bump on at least one of the mounting part metallic film and the connector part metallic film of the carrier substrate, after the semiconductor element is mounted on the bottom area of the mounting part metallic film.

The shield part is removed from the carrier substrate by etching the metallic base. Otherwise, the shield part is removed from the carrier substrate by peeling the shield part off the carrier substrate.

BRIEF DESCRIPTION OF THE ATTACHED DRAWINGS

FIGS. 1(a) to 1(j) illustrate a process for producing a semiconductor device;

Figure 4A:
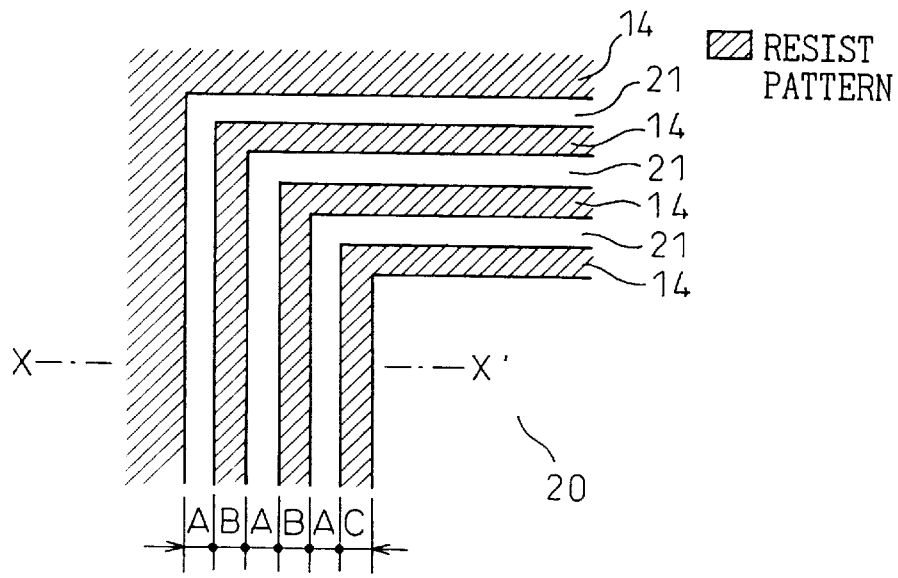
Figure 4B:
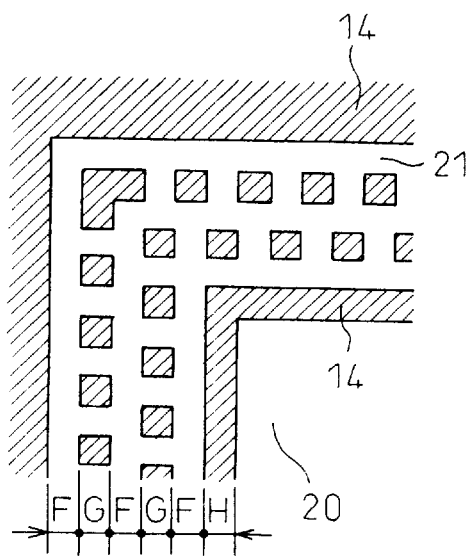
Figure 4C:
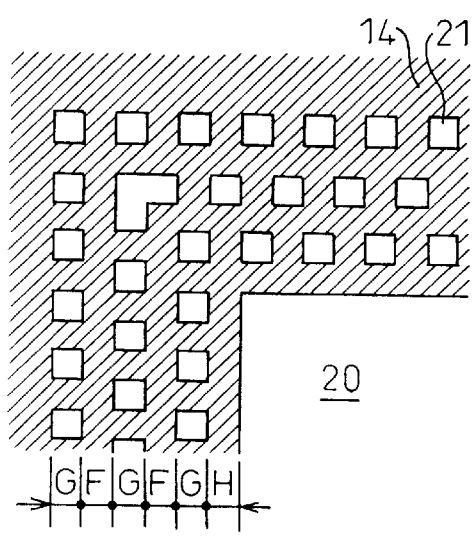
Figure 5:
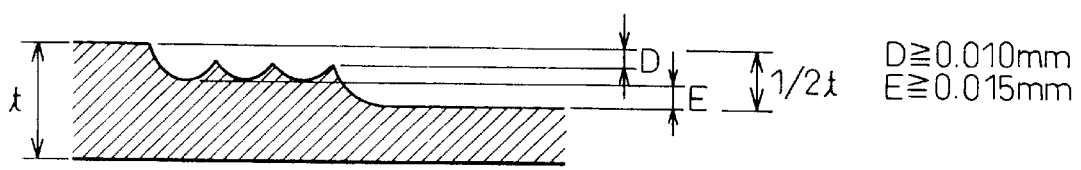
Figure 6:
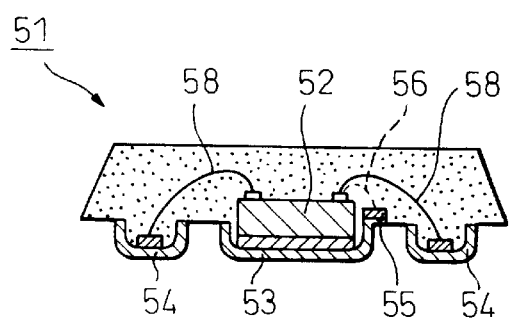
Figure 7A:
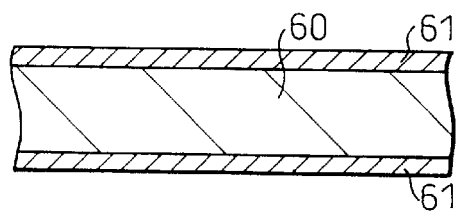
Figure 7B:
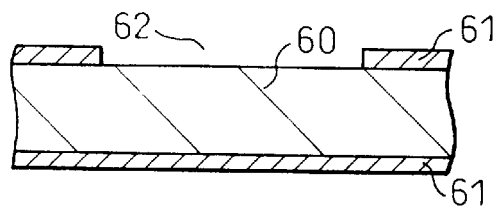
Figure 7C:
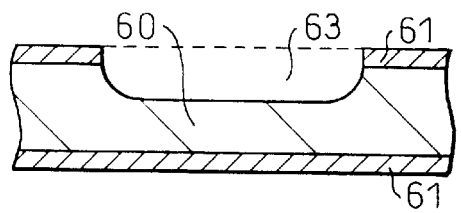
Figure 7D:
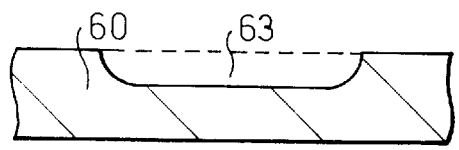
Figure 7E:
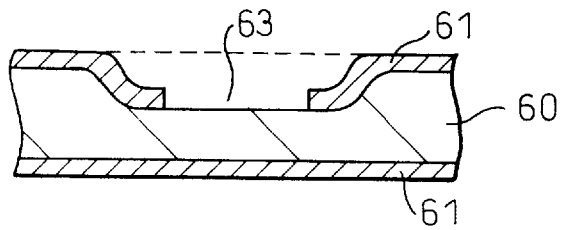
Figure 7F:
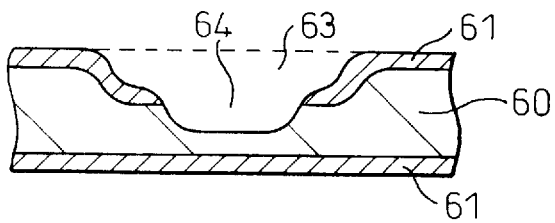
Figure 7G:
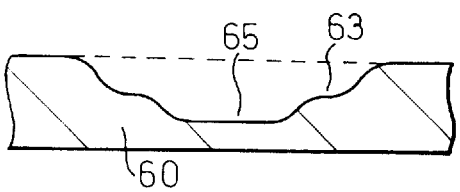
Figure 7H:
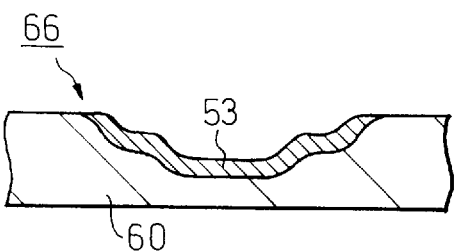
Figure 8A:
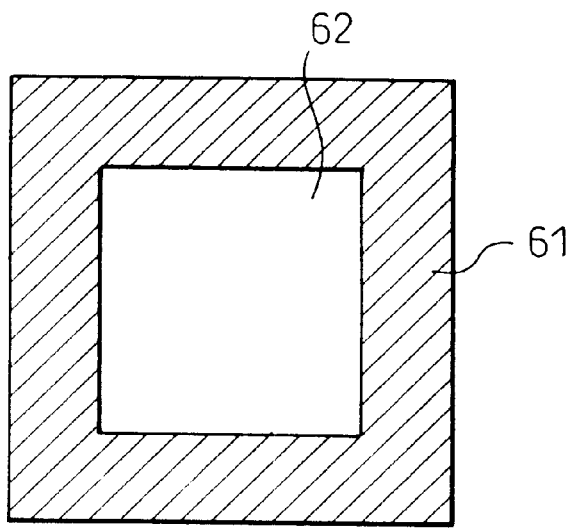
Figure 8B:
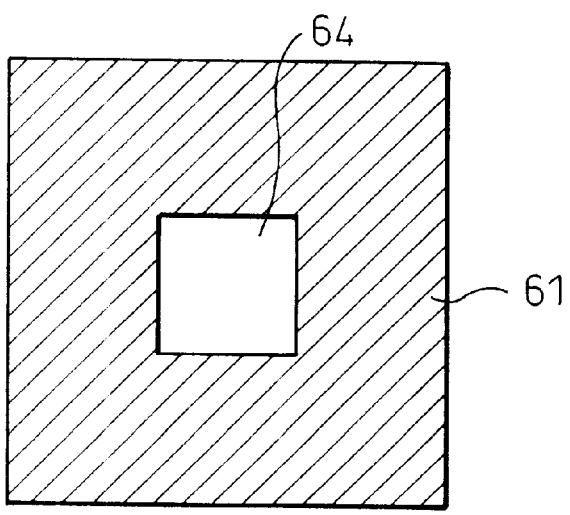

FIGS. 4(a) to 4(c) illustrate some variations of the etching resist pattern;

FIG. 5 shows etching conditions in one embodiment of the present invention;

FIG. 6 is a sectional view of a prior art semiconductor device;

FIGS. 7(a) to 7(h) illustrate a conventional process for producing a carrier substrate; and FIGS. 8(a) and 8(b) illustrate a prior art etching resist, respectively.

DETAILED DESCRIPTION OF THE EMBODIMENTS

The present invention will be described in more detail below with reference to a preferred embodiment illustrated in the attached drawings.

Figure 2:
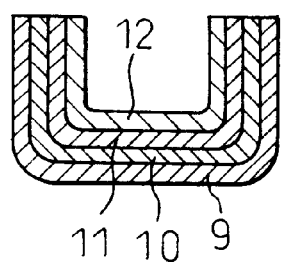
FIG. 2 is a sectional view of one example of a metallic film.
Figure 3:
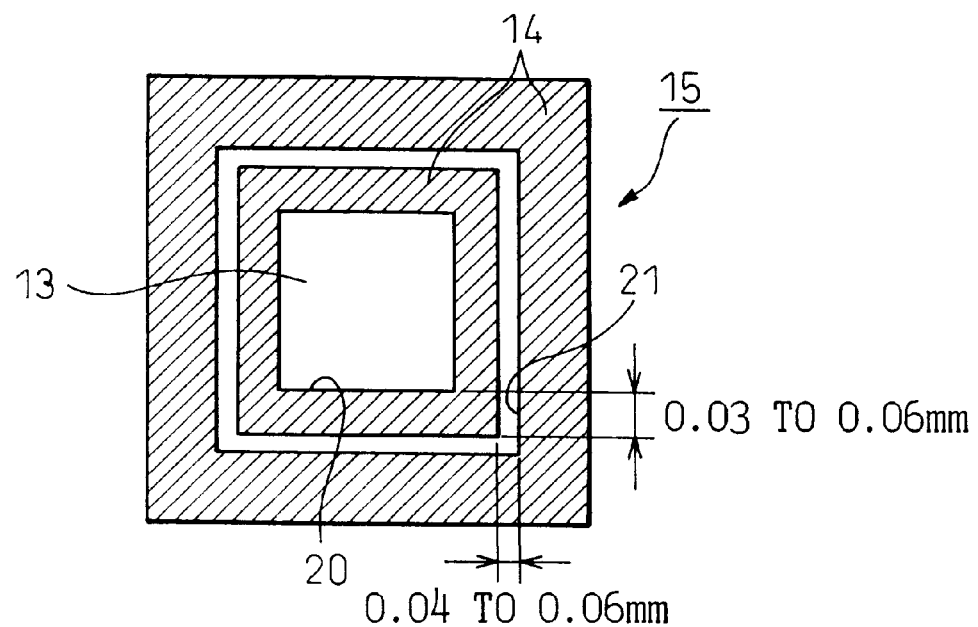
FIG. 3 is a view as seen in the arrowed direction C—C in FIG. 1(b)

In this embodiment, a description will be made of a semiconductor device carrying a high-frequency analog IC thereon used for an electronic equipment such as a mobile phone and a process for the production thereof. FIGS. 1(a) to 1(j) illustrate a process for producing the semiconductor device; FIG. 2 is a sectional view of one example of a metallic film; and FIG. 3 is a view as seen in the arrowed direction C—C in FIG. 1(b).

Initially, a structure of the semiconductor device will be explained. With reference to FIG. 1(j), reference numeral 1 denotes a semiconductor device having the following structure. A semiconductor chip 2 is mounted onto a bottom of a mounting part metallic film 4 formed in a stepwise configuration via an adhesive layer 3. A material excellent in heat dissipation ability and electro-conductivity, such as an electro-conductive epoxy resin containing silver particles, is preferably used for forming the adhesive layer 3. A ground electrode in an electrode section 2a of the semiconductor chip 2 is electrically connected to a shoulder 4a formed around the bottom of the mounting part metallic film 4 at a level higher than the bottom with a gold wire 6 or the like. Also, a signal electrode in the electrode section 2a of the semiconductor chip 2 is electrically connected to a connector part metallic film 5 formed around the mounting part metallic film 4 at a space between the both with a gold wire 6 or the like. The semiconductor chip 2, the mounting part metallic film 4 carrying the semiconductor chip 2 and the connector part metallic film 5 are embedded in a resin-shielding part 7 formed of epoxy resin. The mounting part metallic film 4 and the connector part metallic film 5 are exposed on a mounting surface of the resin-shielded part 7. According to this embodiment, the mounting part metallic film 4 is also used as a die pad, a heat sink and a ground terminal, while the connector part metallic film 5 functions as a connector terminal used as a signal line.

The mounting part metallic film 4 and the connector part metallic film 5 are formed of a multi-layered metallic film. In this embodiment, as shown in FIG. 2, the multi-layered metallic film is constituted as a four-layer film of a gold layer 9, a palladium layer 10, a nickel layer 11 and a palladium layer 12 sequentially overlaid on the outer layer defining the mounting surface. Various combinations of metallic layers may be adoptable while taking the solder adhesiveness of the outer layer with a substrate terminal and that of the inner layer with the wire 6 into account.

Figure 1A:
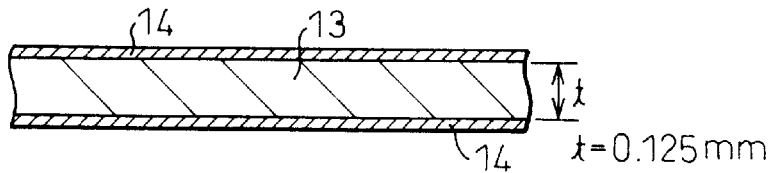
Figure 1B:
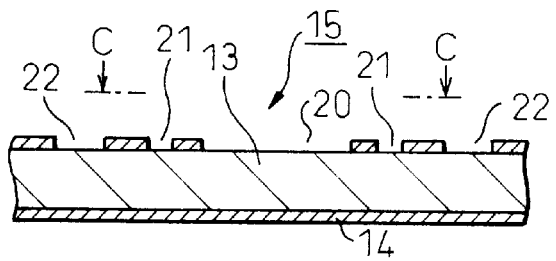

Next, with reference to FIGS. 1(a) to 1(j) and FIG. 3, a process for producing the semiconductor device 1 will be described below:

In FIG. 1(a), an etching resist 14 is coated on respective upper and lower surfaces of a metallic substrate 13 such as a copper plate. The thickness (t) of the metallic substrate is preferably about 0.125 mm. For example, a photosensitive resin is preferably used as the etching resist 14. After overlaying a photo-mask (not shown) on the etching resist 14, part of the etching resist 14 is removed in correspondence with an area in which a metallic film is to be formed by the exposure and development of the etching resist, resulting in a resist pattern 15 shown in FIG. 1(b). More concretely, as shown in FIG. 3, a square central vacant pattern 20 and a square ring-like vacant pattern 21 surrounding the central vacant pattern 20 are formed, respectively, in correspondence to an area in which a mounting recess 16 of the metallic substrate 13 is to be formed. Also, a connection vacant pattern 22 (not shown in FIG. 3) is formed as shown in FIG. 1(b) in correspondence to an area in which a connection recess 17 of the metallic substrate 13 is to be formed. As shown in FIG. 3, the width of the ring-like vacant pattern 21 is preferably 0.03 mm to 0.06 mm and the width of the etching resist 14 between the central and ring-like vacant patterns 20, 21 is preferably 0.04 to 0.06 mm.

Figure 1C:
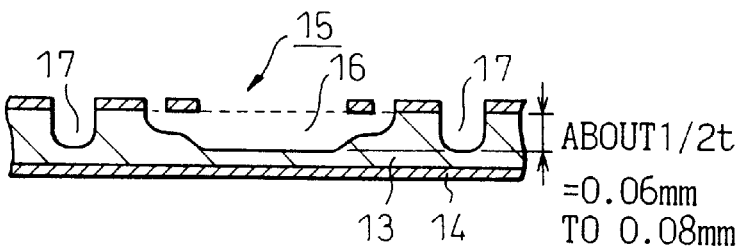

Next, in FIG. 1(c), the metallic substrate 13 is half-etched while using the etching resist as a mask to form the mounting recess 16 and the connection recess 17. More concretely, part of the metallic substrate 13 is removed between the ring-like vacant pattern 21 and the central vacant pattern 20 by the side etching to form the mounting recess 16 having a shoulder or stepped area higher than the central part, and simultaneously therewith, the connection recess 17 is formed around the mounting recess 16 at a distance from the latter.

In such a manner, the mounting recess 16 and the connection recess 17 surrounding the former at a distance therefrom are formed by a single exposure etching process including half-etching and side-etching. In this regard, an area and/or a depth of the half-etching is freely adjustable by changing a design of the mask for the ring-like vacant pattern 21 and the central vacant pattern 20, such as a size and/or a shape thereof. When a copper plate is used as the metallic substrate 13, ferric chloride or the like is preferably used as the etching liquid. The depth of the mounting recess 16 (the central part thereof) and the depth of the connection recess are substantially the same and preferably about ½t≈0.06 mm to 0.08 mm.

Figure 1D:
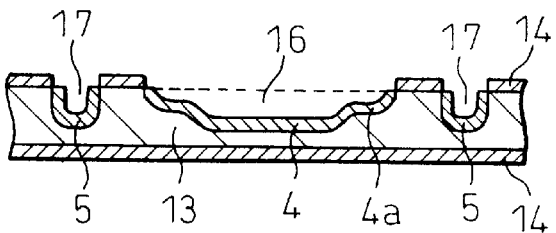

Then, in FIG. 1(d), a multi-layered metallic film is formed in the mounting recess 16 and the connection recess 17 by electrolytic plating while using the etching resist 14 as a mask to result in the mounting part metallic film 4 and the connector part metallic film 5, respectively. The multi-layered metallic film is a four-layered film, as described above, consisting of a gold layer 9, a palladium layer 10, a nickel layer 11 and a palladium layer 12 sequentially overlaid on the outer layer defining the mounting surface. In this regard, the mounting recess 16 and the connection recess 17 may be electrolytically plated after the etching resist 14 has been removed and, instead, a separate resist pattern for the plating has been formed, the electrolytic plating may be carried out in the mounting recess 16 and the connection recess 17.

The metallic film can be formed not only by the electrolytic plating but also by the vapor deposition or the sputtering. To enhance the separation of the metallic film from the metallic substrate 13, the mounting recess 16 and the connection recess 17 may be coated with material for enhancing the separation such as an electro-conductive paste.

Figure 1E:
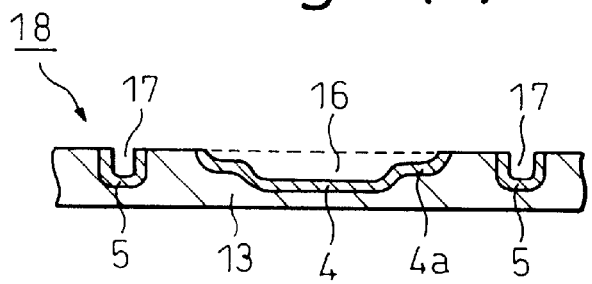

Next, in FIG. 1(e), a carrier substrate 18 is obtained by removing the etching resist coating the respective surfaces of the metallic substrate 13. The mounting part metallic film 4 is formed in a stepwise configuration (as a two-step shoulder in this embodiment) in the central portion of the carrier substrate 18, and the connector part metallic film 5 is formed around the former at a plurality of positions.

Figure 1F:
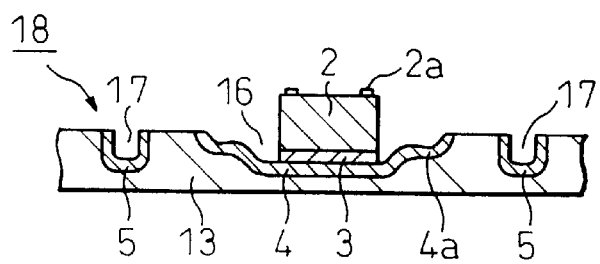

Then, in FIG. 1(f), the semiconductor chip 2 is mounted onto the mounting part metallic film 4 formed in the carrier substrate 18 via the adhesive layer 3.

Figure 1G:
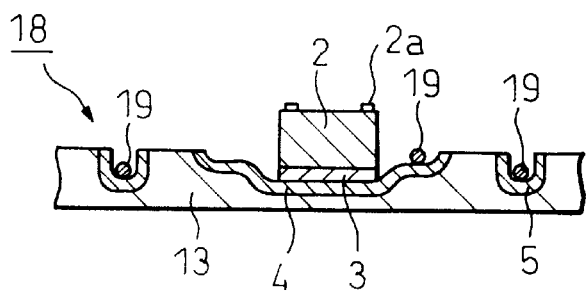

Next, in FIG. 1(g), stud bumps 19 such as gold bumps are formed on the shoulder 4a of the mounting part metallic film 4 and the connector part metallic film 5. The stud bump 19 may be formed as disclosed, for example, in Japanese Unexamined Patent Publication (Kokai) No. 10-79448 by ball-bonding a gold ball to the palladium layer 12, using supersonic welding while using a capillary, once collapsing the gold ball by the downward movement of the capillary, and cutting a gold wire by the upward movement of the capillary. By collapsing the gold ball in such a manner, it is possible to firmly bond the gold ball to the palladium layer 12. Also, since the stud bump 19 and the wire 6 are of the same material, the adhesiveness between the both is facilitated. In this regard, the stud bump 19 may be omitted if the wire 6 can be directly adhered to the connector part metallic film 5 and the shoulder 4a.

Figure 1H:
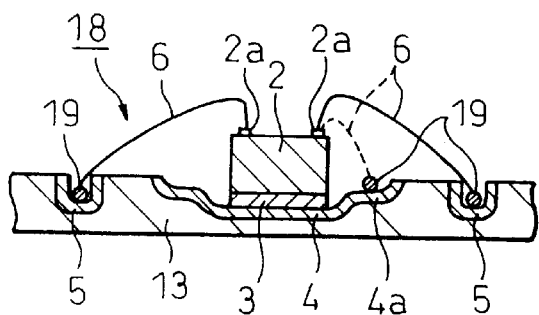

Then, in FIG. 1(h), the electrode section 2a of the semiconductor chip 2 is electrically connected to the stud bumps 19 formed in the mounting part metallic film 4 and the connector part metallic film 5 by the wire 6. In this process, the wire-bonding is carried out in such a manner that one end of the wire 6 is initially bonded to the electrode section 2a, then the other end is bonded to the stud bump 19. Or, one end of the wire 6 may be initially bonded to the stud bump 19, then the other end is bonded to the electrode section 2a. In the latter case, it is possible to reduce the height of a wire loop. In this regard, the gold wire 6 may be a covered wire covered with an insulating material.

Figure 1I:
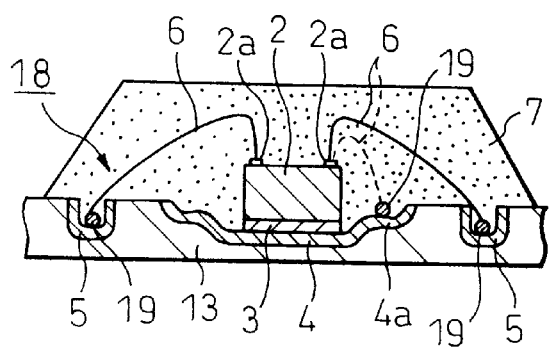
Figure 1J:
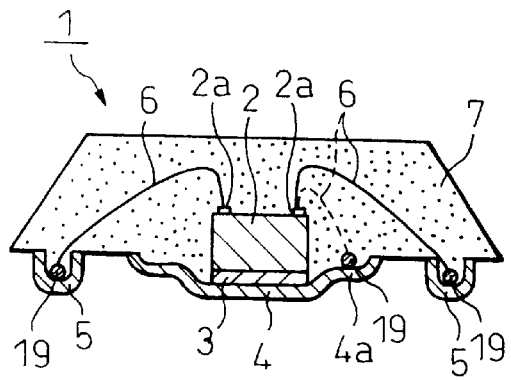

Next, in FIG. 1(i), the carrier substrate 18 is introduced into a resin-shielding device (not shown) to be shielded with epoxy resin. The semiconductor chip 2 and the surface of the mounting part metallic film 4 and the connector part metallic film 5 on which the semiconductor chip is to be mounted are covered with the resin-shielding part 7.

Then, in FIG. 1(j), the resin-shielding part 7 is separated from the carrier substrate 18 together with the mounting part metallic film 4 and the connector part metallic film 5. The separation process may be carried out either by removing the metallic substrate 13 by etching, except for regions corresponding to the mounting part metallic film 4 and the connector part metallic film 5, or by mechanically stripping the resin-shielding part 7 off the carrier substrate 18.

Since the mounting part metallic film 4 of the semiconductor device 1 is formed in a stepwise configuration by the half-etching, it is possible to connect the shoulder 4a formed in the direct vicinity of the semiconductor chip 2 to the ground electrode of the semiconductor chip 2 with the wire 6 of the least length. Thereby, it is possible to form the mounting part metallic film 4 in the ground terminal section, which prevents noise from entering the semiconductor chip 2 to enhance the shielding effect.

Also, since the mounting part metallic film 4 can be formed in a stepwise configuration through a single exposure etching process, it is possible to simplify the production process of the semiconductor device 1 to a great extent, whereby the semiconductor device can be mass-produced at a low cost.

According to the carrier substrate 18 used in the semiconductor device 1 and the method for producing the same, since the mounting part metallic film 4 can be formed in a stepwise configuration by a single exposure etching process, it is unnecessary to carry out a second or further exposure etching process which needs a high accuracy alignment of a photo-mask with an etching pattern formed through a first exposure etching process as in the prior art, resulting in the reduction of rejected product to improve the yield.

FIGS. 4(a) to 4(c) illustrate some variations of the etching resist pattern 14, such as shown in FIG. 3. In FIG. 4(a), there is a square central vacant pattern 20 similar to that of FIG. 3 and there are three square ring-like vacant patterns 21, i.e., inner, intermediate and outer vacant patterns 21. Consequently, there are three square ring-like etching resist patterns 14, i.e., inner, intermediate and outer etching resist patterns 14. The width A of these square ring-like vacant patterns 21 is preferably 0.044 mm. The width B of the outer and intermediate etching resist patterns 14 between the ring-like vacant patterns 21 is preferably 0.036 mm. The width C of the inner etching resist pattern 14 between the inner ring-like vacant pattern 21 and the square central vacant pattern 20 is preferably 0.040 mm.

The etching resist pattern 14 shown in FIG. 4(b) is similar to that of FIG. 4(a), except that the outer and intermediate resist patterns are regularly intermittent. The width F of the vacant patterns 21 is preferably 0.030 mm. The width G of the intermittent etching resist pattern 21 is preferably 0.050 mm. The width H of the inner, continuous etching resist pattern 21 is preferably 0.040 mm.

The etching resist pattern 14 shown in FIG. 4(c) is also similar to that of FIG. 4(a), except that the inner, intermediate and outer square ring-like vacant patterns 21 are regularly intermittent. The width G of the intermittent vacant patterns 21 is preferably 0.030 mm. The width F of the outer and intermediate etching resist patterns 14 is preferably 0.050 mm. The width H of the inner etching resist pattern 14 is preferably 0.040 mm.

FIG. 5 is a schematic cross-sectional view taken along X–X' of FIG. 4(a) and also shows etching conditions in the case of using the etching resist pattern as shown in FIG. 4(a). D indicates a dimension from the upper surface of the metallic substrate 13 to the top of shoulder area of the mounting recess 16 and E indicates a dimension from the bottom of shoulder area to the central part of the mounting recess 16. If the etching time is too long, the dimension D ($D \geq 0.010$ mm) will be unacceptable in such a manner that the etching in the vacant pattern 21 will not be completed. On the other hand, if the etching time is too long, the dimension E ($E \geq 0.015$ mm) will be unacceptable in such a manner that the area of the mounting recess 16 corresponding to the central vacant pattern 20 will be excessively etched. This is due to the difference in etching speed. Therefore, it will be necessary to regulate the etching time so as to satisfy both the dimensions D and E.

When the semiconductor device and the method for the production thereof according to the present invention are used, it is possible to connect the shoulder formed in the direct vicinity of the semiconductor chip to the ground electrode of the semiconductor chip with a wire of the least length because the mounting part metallic film is formed in a stepwise configuration by half etching. Thereby, the mounting part metallic film can be formed in the ground terminal section to prevent noise from entering the semiconductor chip and to enhance the shielding effect.

Since the mounting part metallic film can be formed in a stepwise configuration through a single exposure etching process, it is possible to simplify the process for producing the semiconductor device to a great extent, whereby the semiconductor device can be mass-produced at a low cost.

According to the carrier substrate used in the semiconductor device and the method for producing the same, since the mounting part metallic film can be formed in a stepwise configuration by a single exposure etching process, it is unnecessary to carry out a second or further exposure etching process which needs a high accuracy alignment of a photo-mask with an etching pattern formed through a first exposure etching process as in the prior art, resulting in a reduction of rejected products to improve the yield.

While the description has been made on the preferred embodiments as stated above, the present invention should not be limited to the above-mentioned embodiments but, of course, includes various changes and modifications thereof without departing of the spirit of the invention. For example, structures and/or materials of the multi-layered metallic film may be properly variable or the number of the shoulders 4a of the mounting part metallic film 4 may be optionally selectable.

What is claimed is:

1. A process for producing a carrier substrate comprising the following steps of:
    coating respective surfaces, including a reference surface, of a metallic base with etching resist;
    partially removing said etching resist on said reference surface of the metallic base so as to form a central vacant pattern, a ring-like vacant pattern at a periphery of said central vacant pattern, and a connection vacant pattern spaced from said ring-like vacant pattern;
    half-etching said metallic base by using said etching resist as a mask and side-etching a part of said metallic base between said central vacant pattern and said ring-like vacant pattern so as to form a mount recessed area including a central recessed area and a stepped recessed area located at a periphery of said central recessed area, a depth of said central recessed area from said reference surface being greater than that of said stepped recessed area from said reference surface and also forming a peripheral recessed area spaced from said stepped recessed area and arranged at a peripheral region thereof;

forming a mounting part metallic film and a connector part metallic film on said mount recessed area and on said peripheral recessed area, respectively; and removing said etching resist from said metallic base.

2. A process as set forth in claim 1, wherein said central vacant pattern and said ring-like vacant pattern have a square or rectangular shape.

3. A process for producing a semiconductor device comprising the following steps of:

(a) forming a carrier substrate comprising:

coating respective surfaces, including a reference surface, of a metallic base with etching resist;

partially removing said etching resist on said reference surface of the metallic base so as to form a central vacant pattern, a ring-like vacant pattern at a periphery of said central vacant pattern, and a connection vacant pattern spaced from said ring-like vacant pattern;

half-etching said metallic base by using said etching resist as a mask and side-etching a part of said metallic base between said central vacant pattern and said ring-like vacant pattern so as to form a mount recessed area including a central recessed area and a stepped recessed area located at a periphery of said central recessed area, a depth of said central recessed area from said reference surface being greater than that of said stepped recessed area from said reference surface and also form a peripheral recessed area spaced from said stepped recessed area and arranged at a peripheral region thereof;

forming a mounting part metallic film, including a bottom area and a stepped area located at a periphery of said bottom area, and a connector part metallic film on said mount recessed area and on said peripheral recessed area, respectively;

removing said etching resist from said metallic base;

(b) mounting a semiconductor element, having at least one signal electrode and at least one ground electrode, on said bottom area of the mounting part metallic film;

(c) electrically connecting said signal electrode of the semiconductor element to said connector part and electrically connecting said ground electrode of the semiconductor element to said stepped area of the mounting part metallic film;

(d) shielding with a resin for shielding said semiconductor element, said electrical connecting means, and at least mounting/connecting sides of said mounting part metallic film and said connector part metallic film so as to form a shielded part; and (e) removing said shielded part from said carrier substrate together with said mounting part metallic film and said connector part metallic film.

4. A process as set forth in claim 3 further comprising a step for forming a stud bump on at least one of said mounting part metallic film and said connector part metallic film of the carrier substrate, after said semiconductor element is mounted on said bottom area of the mounting part metallic film.

5. A process as set forth in claim 4, wherein said shield part is removed from said carrier substrate by etching said metallic base.

6. A process as set forth in claim 5, wherein said shield part is removed from said carrier substrate by peeling said shield part off said carrier substrate.

* * * * *